United States Patent
Wang et al.

(10) Patent No.: US 8,426,283 B1
(45) Date of Patent: Apr. 23, 2013

(54) METHOD OF FABRICATING A DOUBLE-GATE TRANSISTOR AND A TRI-GATE TRANSISTOR ON A COMMON SUBSTRATE

(75) Inventors: Chih-Jung Wang, Hsinchu (TW); Tong-Yu Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 8 days.

(21) Appl. No.: 13/293,125

(22) Filed: Nov. 10, 2011

(51) Int. Cl.
*H01L 21/336* (2006.01)
*H01L 21/02* (2006.01)

(52) U.S. Cl.
USPC .......................................... 438/299; 257/346

(58) Field of Classification Search .......... 438/180–183, 438/229, 299; 257/346, 387, E27.063, E27.148
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,037,790 B2 | 5/2006 | Chang | |
| 7,087,477 B2 | 8/2006 | Fried | |
| 7,091,551 B1 | 8/2006 | Anderson | |
| 7,129,550 B2 * | 10/2006 | Fujiwara et al. | 257/401 |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 * | 5/2009 | Brask et al. | 438/585 |
| 7,569,857 B2 | 8/2009 | Simon | |
| 7,859,053 B2 | 12/2010 | Chang | |
| 8,048,723 B2 * | 11/2011 | Chang et al. | 438/135 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |

OTHER PUBLICATIONS

Andrew Carlson, Zheng Guo, Sriram Balasubramanian, Radu Zlatanovici, Tsu-Jae King Liu, and Borivoje Nikolić, "SRAM Read/Write Margin Enhancements Using FinFETs," IEEE Transactions on Very Large Scale Integration (VLSI) Systems, vol. 18, No. 6, Jun. 2010, pp. 887-900., Sep. 1, 2009.

\* cited by examiner

*Primary Examiner* — Calvin Lee
(74) *Attorney, Agent, or Firm* — Winston Hsu; Scott Margo

(57) ABSTRACT

A method of fabricating a double-gate transistor and a tri-gate transistor on a common substrate, in which, a substrate includes a first fin structure covered with a first mask layer and a second fin structure covered with a second mask layer, the first mask layer is removed, a gate material layer is formed and covers the first fin structure and the second mask layer, the gate material layer is patterned to result in a tri-gate structure covering the first fin structure and a double-gate structure covering the second fin structure and the second mask layer, and a source and a drain are formed in each of these two fin structures each at two sides of the gates.

15 Claims, 5 Drawing Sheets

METHOD OF FABRICATING A DOUBLE-GATE TRANSISTOR AND A TRI-GATE TRANSISTOR ON A COMMON SUBSTRATE

BACKGROUND OF THE INVENTION

1. Field of the Invention

The present invention relates to a method of fabricating a field effect transistor (FET) with a fin structure, and, particularly, to a method of fabricating a double-gate transistor and a tri-gate transistor on a common substrate.

2. Description of the Prior Art

With the trend in the industry being towards scaling down the size of metal oxide semiconductor transistors (MOS), three-dimensional or non-planar transistor technology, such as fin field effect transistor technology (Fin-FET) has been developed to replace planar MOS transistors. The three-dimensional structure of a fin-FET can increase the overlapping area between the gate and the fin structure of the silicon substrate for scaling down the size and also improve the short channel effect with a thinner fin body. In certain integrated circuits, a double-gate transistor and a tri-gate transistor can be both disposed on a common substrate for improving performance and yield. The double-gate transistor has two gates on the two opposite sidewalls of a fin structure, i.e. two independent gate channels, and each gate can be independently controlled for electrical properties. The tri-gate transistor has a single gate including a gate material layer continuously covering the two opposite sidewalls and the top of a fin structure, i.e. a composite gate channel.

With the demand for a common substrate on which both a double-gate and a tri-gate transistors are disposed, there is still a need for a novel method of fabricating a double-gate and a tri-gate transistors to be more convenient and economical.

SUMMARY OF THE INVENTION

One objective of the present invention is to provide a method of fabricating a fin-FET to fabricate a double-gate transistor and a tri-gate transistor on a common substrate.

In one aspect according to an embodiment of the present invention, the method of fabricating a double-gate transistor and a tri-gate transistor on a common substrate comprises steps as follows. First, a substrate is provided. The substrate includes a first fin structure and a second fin structure. A first mask layer covers the first fin structure, and a second mask layer covers the second fin structure. Thereafter, the first mask layer is removed. A gate material layer is formed to cover the first fin structure and the second mask layer. The gate material layer is patterned to form a tri-gate structure covering the first fin structure and a double-gate structure covering the second fin structure and the second mask layer. A first source and a first drain are formed in the first fin structure at two sides of the tri-gate structure, and a second source and a second drain are formed in the second fin structure at two sides of the double-gate structure.

In the present invention, a double-gate transistor and a tri-gate transistor can be formed simultaneously in one process flow on a common substrate, and the fabrication may be compatible with a current manufacturing process flow and accordingly it is convenient and economical.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
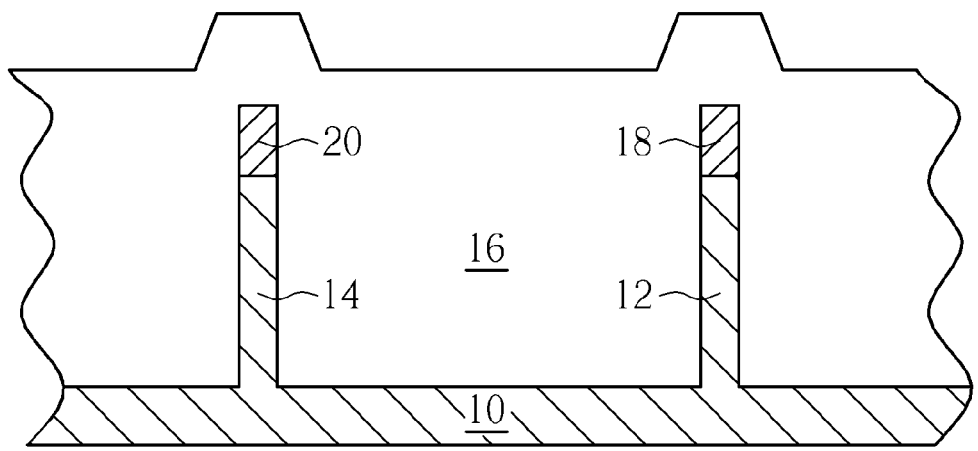
FIGS. 1 to 7 are schematic cross-sectional views illustrating a method of fabricating a double-gate transistor and a tri-gate transistor on a common substrate according to an embodiment of the present invention.
Figure 2:
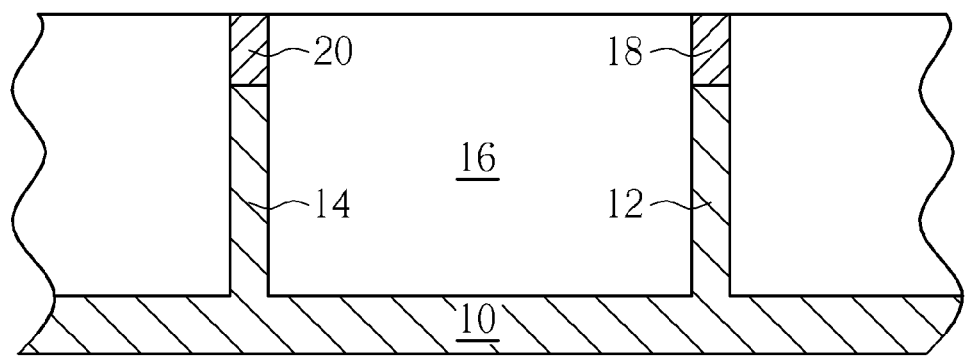

Referring to FIGS. 1 to 8, a method of fabricating a double-gate transistor and a tri-gate transistor on a common substrate according to an embodiment of the present invention is described hereinafter. First, referring to FIG. 1, a substrate 10 is provided. The substrate 10 may be for example a semiconductor substrate, such as a silicon substrate. A first fin structure 12 and a second fin structure 14 which are each in a fin shape may be formed by etching the substrate through a patterned hard mask layer. The patterned hard mask layer may be formed by forming a hard mask layer including for example silicon nitride on the substrate and patterning the hard mask layer using for example a photolithography and etching process. Two portions of the patterned hard mask layer, that is, the first mask layer 18 and the second mask layer 20, remain to cover the first fin structure 12 and the second fin structure 14, respectively.

Thereafter, a planar insulation layer is formed and covers the substrate to expose the first and the second mask layers. For example, as shown in FIG. 1, an insulation layer 16 is formed on the substrate 10 to cover the first mask layer 18 and the second mask layer 20. Thereafter, referring to FIG. 2, the insulation layer 16 on the substrate 10 is planarized using for example a chemical mechanical polishing (CMP) process for exposing the first mask layer 18 and the second mask layer 20. The insulation layer 16 may include for example oxide, such as silicon oxide. The insulation layer 16 may be formed utilizing for example a chemical vapor deposition (CVD) process.

Figure 3:
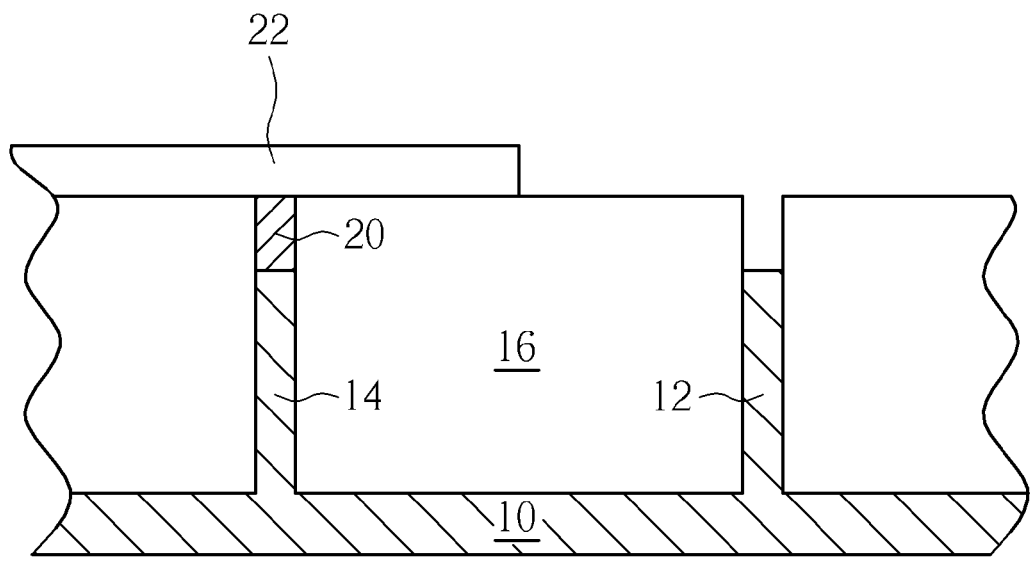

Thereafter, referring to FIG. 3, only the first mask layer 18 is removed, and the second mask layer 20 remains on the second fin structure. The first mask layer 18 may be removed by etching through for example a patterned photoresist layer 22 which is formed by a photolithography process to cover the second mask layer 20 and expose the first mask layer 18. Thereafter, the photoresist layer 22 is removed.

Figure 4:
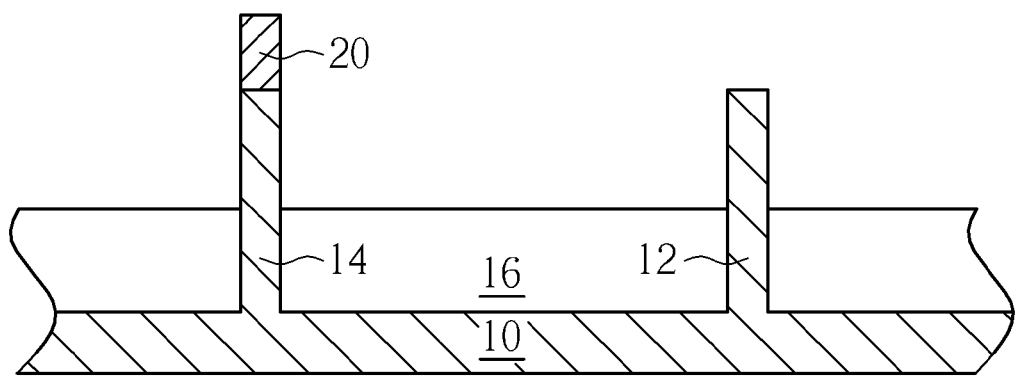

Thereafter, referring to FIG. 4, the insulation layer 16 is etched back to a thickness to expose the upper portion of the first fin structure 12 and the upper portion of the second fin structure 14 as well as the second mask layer 20 covering the second fin structure 14. The etched-back insulation layer 16 may serve as a shallow trench isolation (STI). Therefore, material for the insulation layer 16, etch-back procedures and the predetermined thickness of the etched-back insulation layer may be selected as desired for the STI.

The isolation structure may be formed in other ways. For example, before or after the first mask layer 18 is removed, an insulation layer may be formed to cover the substrate, the insulation layer may be planarized or not planarized as required or desired, and thereafter the insulation layer is etched back to a thickness to expose an upper portion of the first fin structure 12 and an upper portion of the second fin structure 14. Such remaining thickness of the insulation layer is allowed to serve as an isolation structure.

A gate dielectric layer (not shown) may be formed on the surface of the two sidewalls and the top of the first fin structure 12 and the two sidewalls of the second fin structure 14, i.e. the gate channel regions. The gate dielectric layer may include dielectric material such as silicon oxide, silicon nitride, silicon oxynitride and the like or high k dielectric material.

Figure 5:
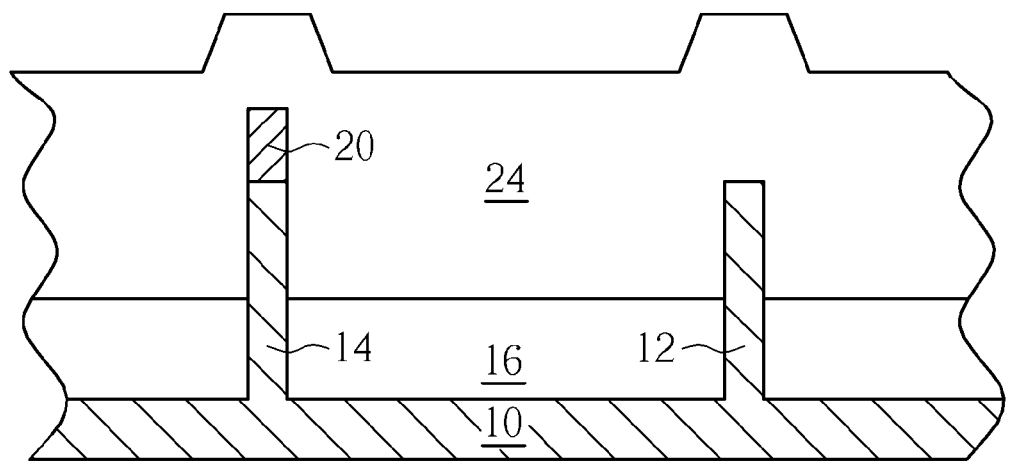

Thereafter, referring to FIG. 5, a gate material layer 24 is formed on the insulation layer 16 and covers the first fin structure 12 and a second mask layer 20. The gate material layer 24 may include for example polysilicon or metal suitable for serving as gate material. The gate material layer may be formed in a suitable conventional process, such as CVD or PVD process, selected according to the material.

Thereafter, the gate material layer is patterned. There are various ways for the patterning. For example, referring to FIG. 6, in an embodiment, the gate material layer 24 is planarized to expose the second mask layer 20. In such situation, the first fin structure 12 is covered with the gate material layer 24. The planarization may be accomplished by for example a CMP process. Thereafter, a patterned mask layer 26 is formed on the planarized gate material layer 24 and covers the locations for desired gate structures.

Figure 7:
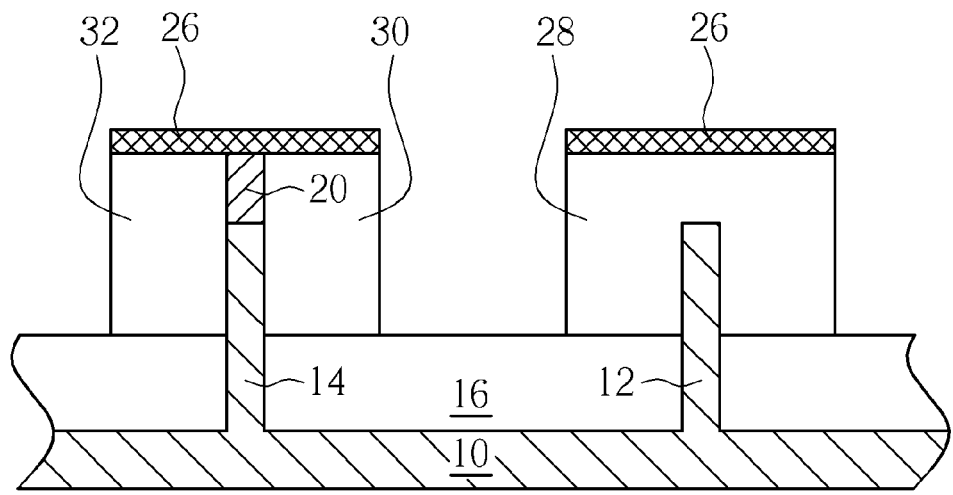
Figure 8:
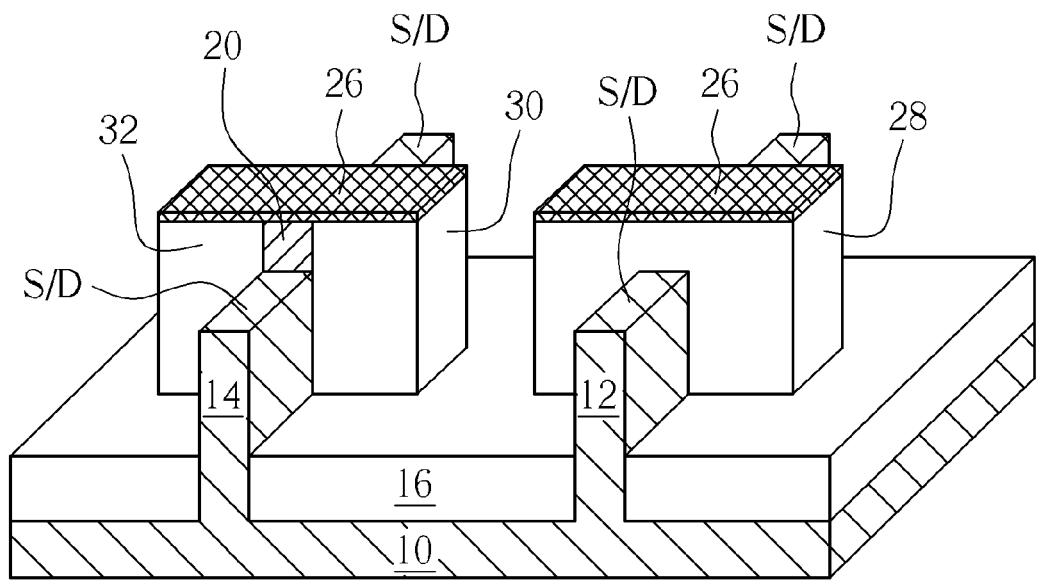
FIG. 8 is a schematic perspective view corresponding to FIG. 7.

Thereafter, referring to FIG. 7, the gate material layer 24 is etched through the mask layer 26 to form a tri-gate structure 28 covering the first fin structure 12 and a double-gate structure covering the second fin structure 14 and the second mask layer 20. The double-gate structure may include the gates 30 and 32 which are independently controlled. FIG. 8 is a schematic perspective view corresponding to FIG. 7. Thereafter, the remaining mask layers 18 or 20 on the predetermined source/drain regions of the first fin structure or the second fin structure may be removed. Thereafter, a source and a drain are formed in the first fin structure 12 at two sides of the tri-gate structure 28, and a source and a drain are formed in the second fin structure 14 at two sides of the gates 30 and 32 of the double-gate structure, through for example an ion implantation. A light doped drain (LDD) may be formed before the source/drain is formed. Accordingly, a double-gate transistor and a tri-gate transistor may be formed on a common substrate as described above.

Figure 6:
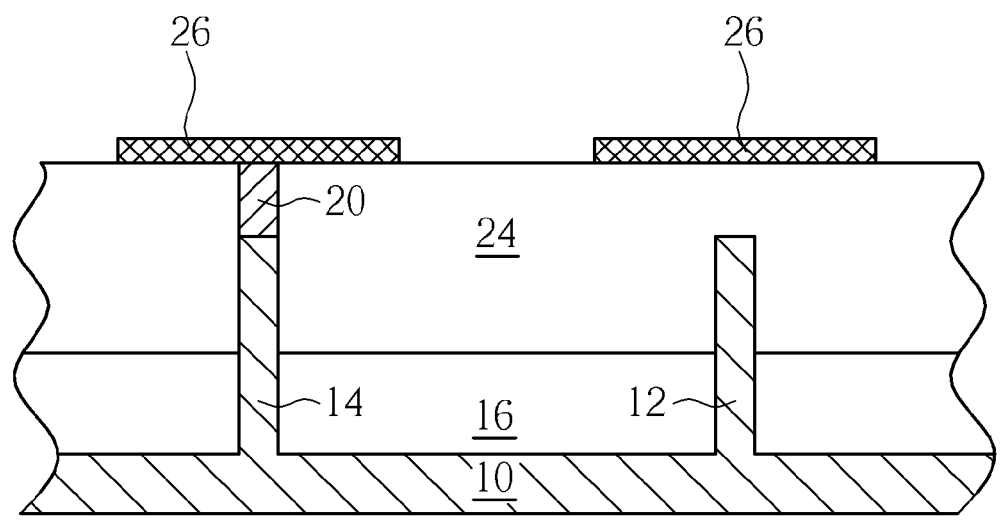
Figure 9:
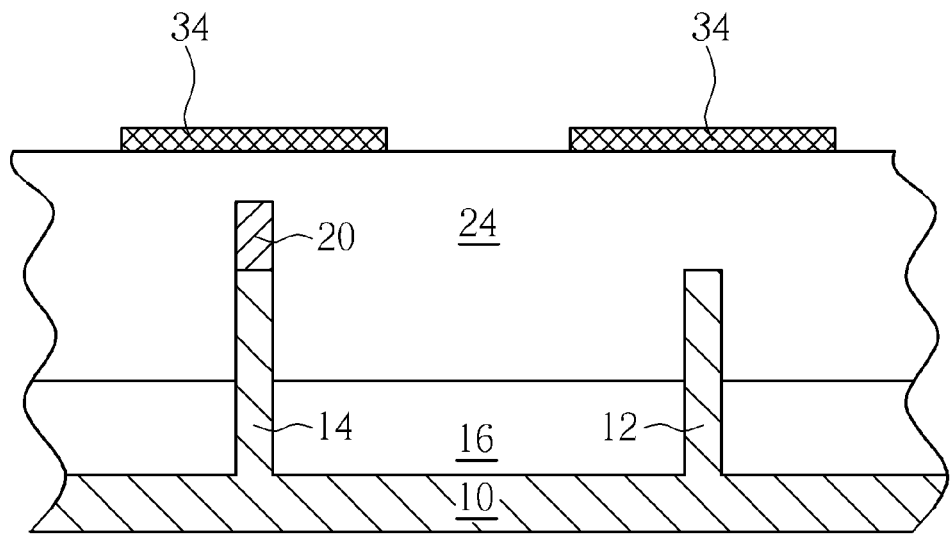
FIG. 9 is a schematic cross-sectional view illustrating a method of fabricating a double-gate transistor and a tri-gate transistor on a common substrate according to another embodiment of the present invention.

FIG. 9 illustrates another embodiment to pattern the gate material layer. The difference from the embodiment shown in FIG. 6 is that the second mask layer 20 is not exposed from the gate material layer 24 after the planarization of the gate material layer 24. That is, both the fin structure 12 and the second mask layer 20 are covered with the gate material layer 24. Thereafter, a patterned mask layer 34 is formed on the planarized gate material layer 24 to cover the locations for desired gate structures.

Figure 10:
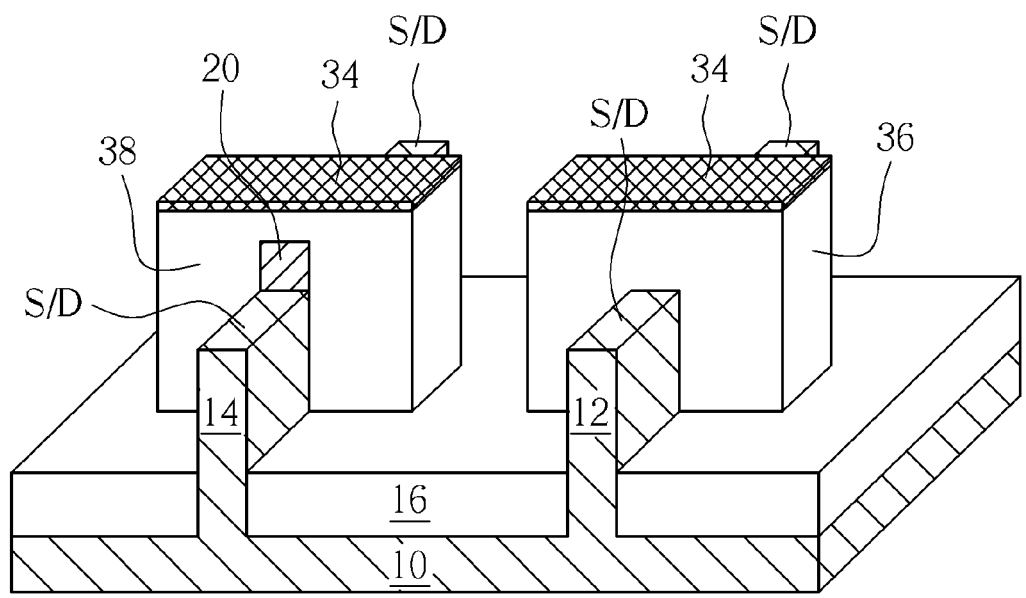
FIG. 10 is a schematic perspective view corresponding to FIG. 9.

Thereafter, as shown in FIG. 10, the gate material layer 24 is etched through the mask layer 34 to form a tri-gate structure 36 covering the first fin structure 12 and a double-gate structure 38 covering the second fin structure 14 and the second mask layer 20. The double-gate structure 38 has a shape similar to a tri-gate structure; however, the second mask layer 20 is still between the second fin structure 14 and the gate material layer thereabove. When the second mask layer 20 has a suitable thickness, two portions of the double-gate structure 38 covering the surface of the two sidewalls of the second fin structure 14 are still capable of serving as two independently-controlled gates. However, with the spirit and in the scope of the present invention, it is also allowed that the second mask layer 20 is thin. When the second mask layer 20 is thin enough, the double-gate structure 38 may become a single gate. Thereafter, as described above, a source and a drain are formed in the first fin structure 12 at two sides of the tri-gate structure 36, and a source and a drain are formed in the second fin structure 14 at two sides of the double-gate structure 38. An LDD may be formed before the source/drain is formed. Accordingly, a double-gate transistor and a tri-gate transistor may be formed on a common substrate as described above.

Furthermore, the method of fabricating a double-gate transistor and a tri-gate transistor on a common substrate according to the present invention may be suitable for a "gate first" process or a "gate last" process. In the gate first process, the desired gates are formed and thereafter the source and the drain are formed, as steps described above. In the gate last process, dummy gates are formed, thereafter the source and the drain are formed, and thereafter, the dummy gates are replaced with desired gate material. For example, following the aforesaid gate first process, the gate material for the dummy gates may include for example polysilicon, and, thereafter, a gate replacement process may be performed utilizing a conventional technology to replace the polysilicon material with metal for metal gates or to cover a channel region (not shown) with at least a high-K dielectric layer (not shown), at least a work function tuning layer (not shown), and at least a metal conductive layer (not shown) for the gate structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a double-gate transistor and a tri-gate transistor on a common substrate, comprising:
    providing a substrate comprising a first fin structure and a second fin structure, a first mask layer covering the first fin structure, and a second mask layer covering the second fin structure;
    removing the first mask layer;
    forming a gate material layer to cover the first fin structure and the second mask layer;
    patterning the gate material layer to form a tri-gate structure covering the first fin structure and a double-gate structure covering the second fin structure and the second mask layer; and
    forming a first source and a first drain in the first fin structure, respectively, at two sides of the tri-gate structure and a second source and a second drain in the second fin structure, respectively, at two sides of the double-gate structure.

2. The method of claim 1, wherein providing a substrate comprises steps of:
    forming a patterned mask comprising the first mask layer and the second mask layer on the substrate; and
    etching the substrate through the patterned mask to form the first fin structure covered with the first mask layer and the second fin structure covered with the second mask layer.

3. The method of claim 1, further, before removing the first mask layer, comprising:
    forming a planar insulation layer covering the substrate and exposing the first and the second mask layers;

and, after removing the first mask layer, comprising:
  etching back the insulation layer to a thickness for serving as an isolation structure and expose an upper portion of the first fin structure and an upper portion of the second fin structure.

4. The method of claim 3, wherein, forming the planar insulation layer comprises:
  forming an insulation layer covering the first mask layer and the second mask layer on the substrate; and
  performing a chemical mechanical polishing process to form the planar insulation layer and expose the first mask layer and the second mask layer.

5. The method of claim 3, wherein, removing the first mask layer comprises steps of:
  forming a photoresist layer on the second mask layer;
  performing an etch process to remove the first mask layer; and
  removing the photoresist layer.

6. The method of claim 1, further, before removing the first mask layer, comprising:
  forming an insulation layer covering the substrate; and
  etching back the insulation layer to a thickness for serving as an isolation structure and expose an upper portion of the first fin structure and an upper portion of the second fin structure.

7. The method of claim 1, further, after removing the first mask layer, comprising:
  forming an insulation layer covering the substrate; and
  etching back the insulation layer to a thickness for serving as an isolation structure and expose an upper portion of the first fin structure and an upper portion of the second fin structure.

8. The method of claim 1, wherein, removing the first mask layer comprises steps of:
  forming a photoresist layer on the second mask layer;
  performing an etch process to remove the first mask layer; and
  removing the photoresist layer.

9. The method of claim 1, further comprising:
  forming a gate dielectric layer on two sidewalls and a top of the first fin structure and the two sidewalls of the second fin structure.

10. The method of claim 1, wherein, patterning the gate material layer to form the tri-gate structure and the double-gate structure comprises steps of:
  planarizing the gate material layer;
  forming a patterned third mask layer on the gate material layer; and
  etching the gate material layer through the third mask layer.

11. The method of claim 10, wherein, planarizing the gate material layer is performed to expose the second mask layer.

12. The method of claim 11, wherein, planarizing the gate material layer comprises performing a chemical mechanical polishing process on the gate material layer.

13. The method of claim 10, wherein, planarizing the gate material layer is performed while not to expose the second mask layer.

14. The method of claim 13, wherein, planarizing the gate material layer comprises performing a chemical mechanical polishing process on the gate material layer.

15. The method of claim 10, wherein, planarizing the gate material layer comprises performing a chemical mechanical polishing process on the gate material layer.

* * * * *